United States Patent
Lin et al.

(10) Patent No.: US 9,082,832 B2
(45) Date of Patent: *Jul. 14, 2015

(54) SEMICONDUCTOR DEVICE AND METHOD OF FORMING PROTECTION AND SUPPORT STRUCTURE FOR CONDUCTIVE INTERCONNECT STRUCTURE

(75) Inventors: Yaojian Lin, Singapore (SG); Kang Chen, Singapore (SG); Jianmin Fang, Shanghai (CN)

(73) Assignee: STATS ChipPAC, Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/478,008

(22) Filed: May 22, 2012

(65) Prior Publication Data

US 2013/0069227 A1    Mar. 21, 2013

Related U.S. Application Data

(63) Continuation-in-part of application No. 13/239,080, filed on Sep. 21, 2011.

(51) Int. Cl.
*H01L 21/50* (2006.01)
*H01L 21/768* (2006.01)
(Continued)

(52) U.S. Cl.
CPC ........ *H01L 21/76898* (2013.01); *H01L 21/486* (2013.01); *H01L 23/49827* (2013.01); *H01L 24/03* (2013.01); *H01L 24/05* (2013.01); *H01L 24/11* (2013.01); *H01L 24/13* (2013.01); *H01L 21/481* (2013.01); *H01L 2224/02372* (2013.01); *H01L 2224/03002* (2013.01); *H01L 2224/0347* (2013.01); *H01L 2224/0391* (2013.01); *H01L 2224/05001* (2013.01); *H01L 2224/05027* (2013.01); *H01L 2224/0554* (2013.01); *H01L 2224/05111* (2013.01);
(Continued)

(58) Field of Classification Search
CPC .............................. H01L 21/486; H01L 24/05
USPC .......................... 438/617, 113, 106, 122, 108
See application file for complete search history.

(56) References Cited

U.S. PATENT DOCUMENTS

| | | |
|---|---|---|
| 5,757,078 A | 5/1998 | Matsuda et al. |
| 6,593,220 B1 | 7/2003 | Yu et al. |

(Continued)

FOREIGN PATENT DOCUMENTS

| | | |
|---|---|---|
| JP | 357007141 A | 1/1982 |
| WO | 2010150912 A1 | 12/2010 |

*Primary Examiner* — Nathan Ha
(74) *Attorney, Agent, or Firm* — Robert D. Atkins; Patent Law Group: Atkins and Associates, P.C.

(57) ABSTRACT

A semiconductor device has a semiconductor wafer with a plurality of contact pads. A first insulating layer is formed over the semiconductor wafer and contact pads. A portion of the first insulating layer is removed, exposing a first portion of the contact pads, while leaving a second portion of the contact pads covered. An under bump metallization layer and a plurality of bumps is formed over the contact pads and the first insulating layer. A second insulating layer is formed over the first insulating layer, a sidewall of the under bump metallization layer, sidewall of the bumps, and upper surface of the bumps. A portion of the second insulating layer covering the upper surface of the bumps is removed, but the second insulating layer is maintained over the sidewall of the bumps and the sidewall of the under bump metallization layer.

21 Claims, 15 Drawing Sheets

(51) Int. Cl.
  *H01L 23/00* (2006.01)
  *H01L 23/498* (2006.01)
  *H01L 21/48* (2006.01)

(52) U.S. Cl.
  CPC ........... *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05169* (2013.01); *H01L 2224/05171* (2013.01); *H01L 2224/05181* (2013.01); *H01L 2224/05548* (2013.01); *H01L 2224/05552* (2013.01); *H01L 2224/05567* (2013.01); *H01L 2224/05572* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/10126* (2013.01); *H01L 2224/1147* (2013.01); *H01L 2224/1191* (2013.01); *H01L 2224/11849* (2013.01); *H01L 2224/13013* (2013.01); *H01L 2224/13014* (2013.01); *H01L 2224/13022* (2013.01); *H01L 2224/48091* (2013.01); *H01L 2224/73104* (2013.01); *H01L 2224/73265* (2013.01); *H01L 2224/94* (2013.01); *H01L 2924/01322* (2013.01); *H01L 2924/13091* (2013.01)
  USPC ........................................................ 438/113

(56) References Cited

U.S. PATENT DOCUMENTS

| | | | |
|---|---|---|---|
| 6,734,084 B1 | 5/2004 | Nemoto et al. | |
| 6,806,578 B2 * | 10/2004 | Howell et al. | 257/762 |
| 6,809,421 B1 * | 10/2004 | Hayasaka et al. | 257/777 |
| 6,864,168 B2 | 3/2005 | Chen et al. | |
| 6,921,715 B2 | 7/2005 | Shen | |
| 7,129,111 B2 * | 10/2006 | Tsai | 438/106 |
| 7,214,615 B2 | 5/2007 | Miyazawa | |
| 7,432,188 B2 | 10/2008 | Tsai et al. | |
| 7,473,998 B2 | 1/2009 | Tsai | |
| 7,910,473 B2 | 3/2011 | Chen | |
| 8,368,187 B2 * | 2/2013 | Pagaila | 257/660 |
| 2003/0071352 A1 * | 4/2003 | Ohuchi et al. | 257/737 |
| 2005/0056933 A1 | 3/2005 | Chung | |
| 2005/0093150 A1 | 5/2005 | Nakatani | |
| 2006/0186542 A1 * | 8/2006 | Wakabayashi et al. | 257/737 |
| 2006/0192280 A1 | 8/2006 | Esler et al. | |
| 2007/0075425 A1 * | 4/2007 | Morita et al. | 257/737 |
| 2007/0085189 A1 * | 4/2007 | Sunohara et al. | 257/686 |
| 2007/0087546 A1 | 4/2007 | Wu et al. | |
| 2008/0003716 A1 | 1/2008 | Takahashi | |
| 2008/0128690 A1 | 6/2008 | Burnside et al. | |
| 2008/0284012 A1 * | 11/2008 | Okayama et al. | 257/737 |
| 2009/0032975 A1 | 2/2009 | Do et al. | |
| 2009/0140421 A1 | 6/2009 | Lin et al. | |
| 2009/0243047 A1 | 10/2009 | Wolter et al. | |
| 2010/0059855 A1 | 3/2010 | Lin et al. | |
| 2010/0065942 A1 | 3/2010 | Lin et al. | |
| 2010/0109159 A1 | 5/2010 | Ho et al. | |
| 2011/0031615 A1 * | 2/2011 | Inomata | 257/737 |
| 2011/0049705 A1 | 3/2011 | Liu et al. | |
| 2011/0169158 A1 | 7/2011 | Varanasi | |
| 2011/0198750 A1 * | 8/2011 | Nakatani | 257/737 |
| 2011/0215470 A1 | 9/2011 | Chen et al. | |
| 2011/0291263 A1 * | 12/2011 | West | 257/737 |
| 2012/0104602 A1 | 5/2012 | Nanba | |

* cited by examiner

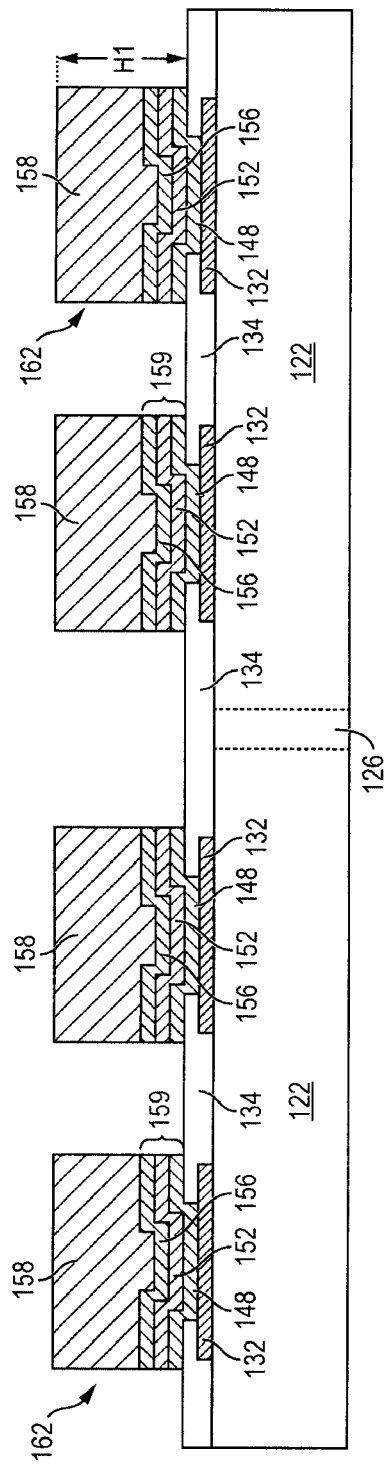
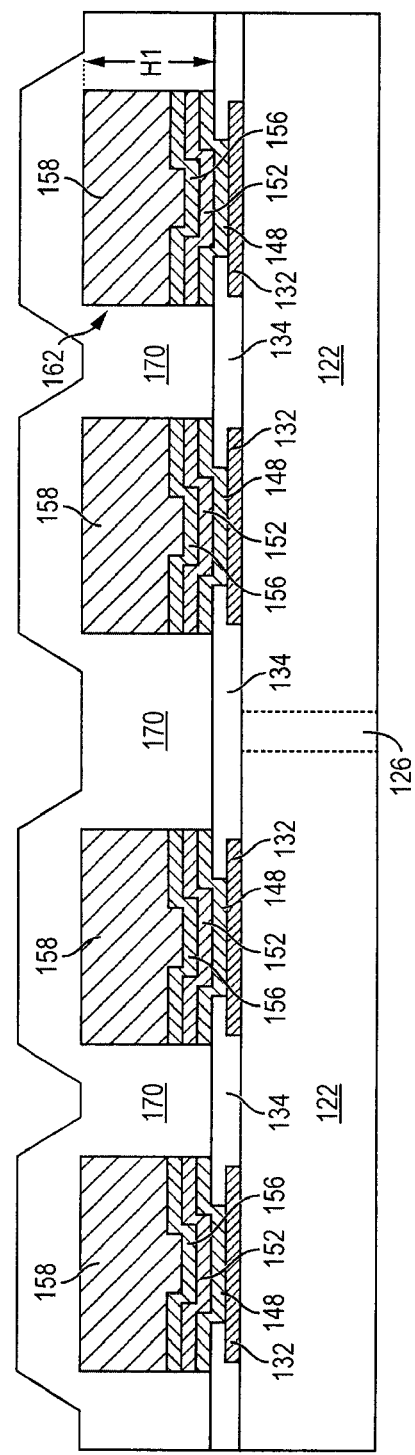
FIG. 3g
FIG. 3h

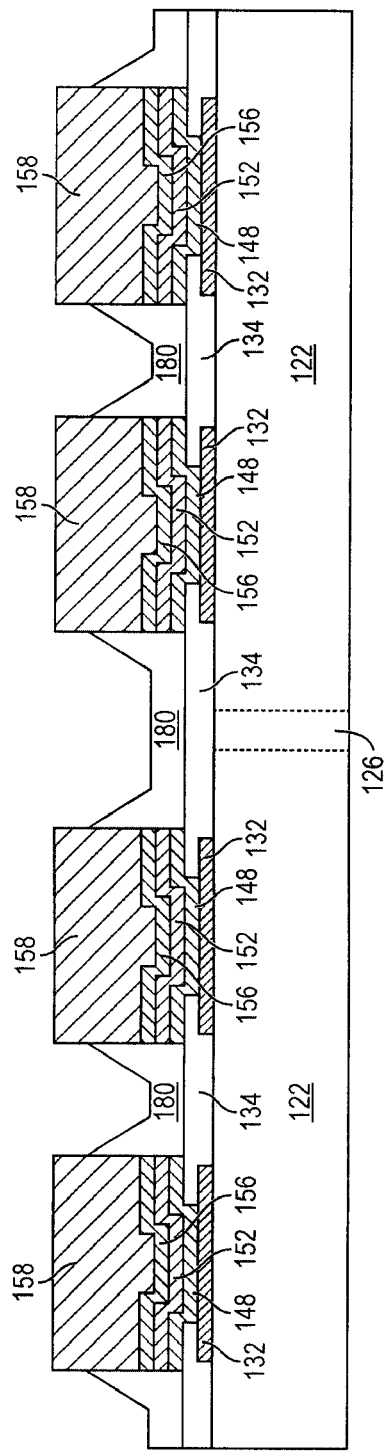
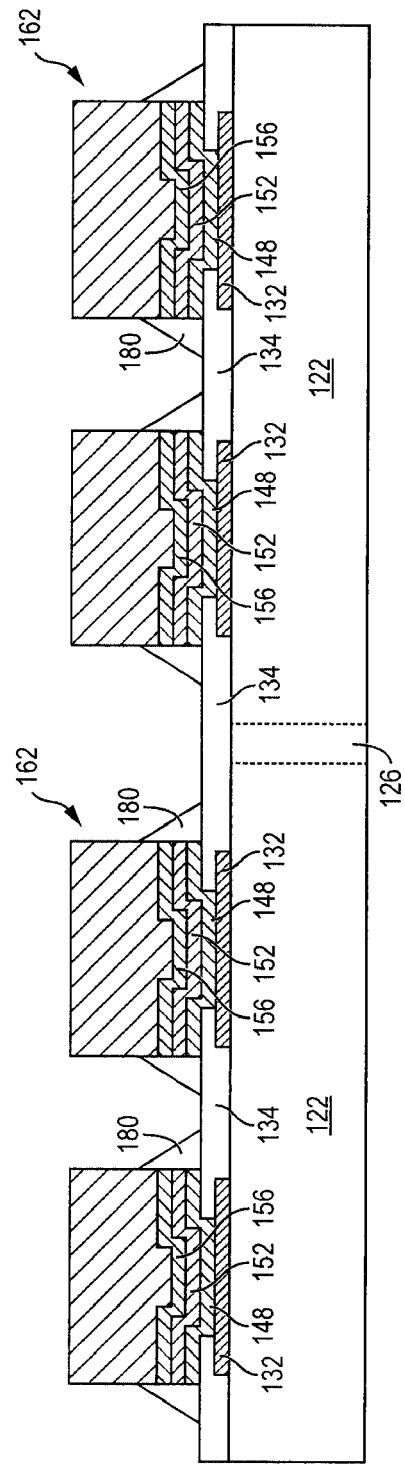

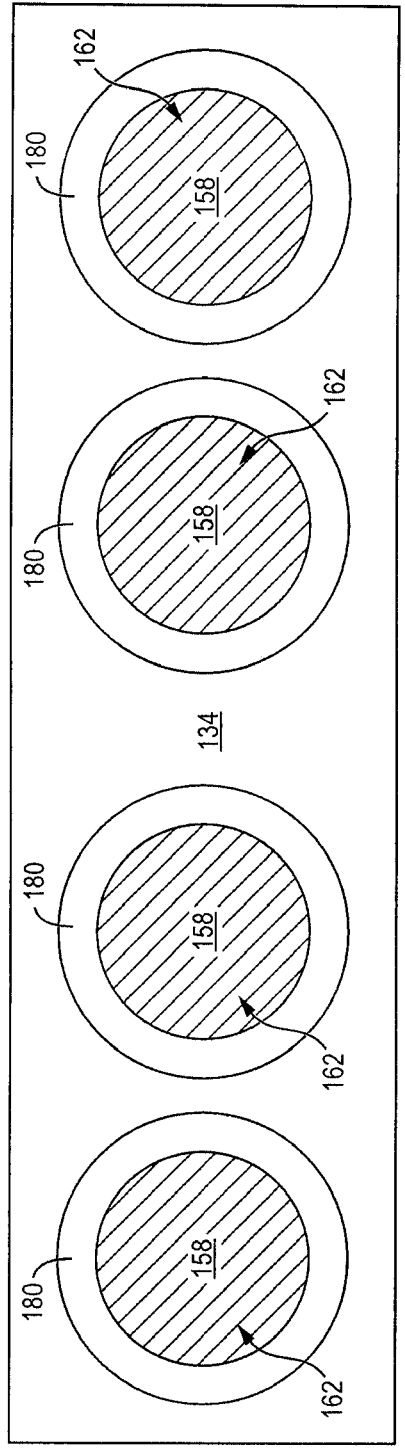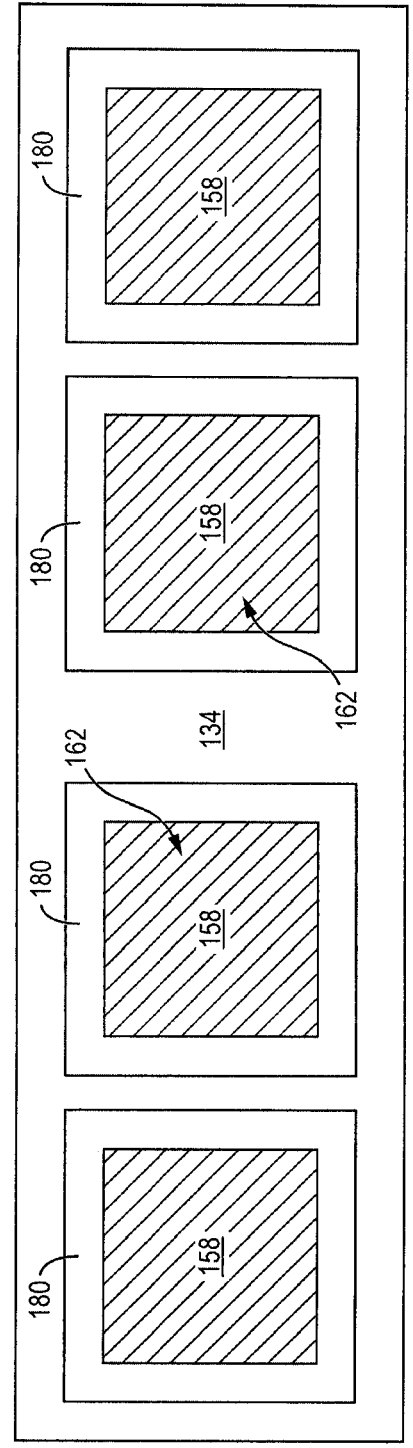
FIG. 3k
FIG. 3l

US 9,082,832 B2

SEMICONDUCTOR DEVICE AND METHOD OF FORMING PROTECTION AND SUPPORT STRUCTURE FOR CONDUCTIVE INTERCONNECT STRUCTURE

CLAIM TO DOMESTIC PRIORITY

The present application is a continuation-in-part of U.S. patent application Ser. No. 13/239,080, filed Sep. 21, 2011, which application is incorporated herein by reference.

FIELD OF THE INVENTION

The present invention relates in general to semiconductor devices and, more particularly, to a semiconductor device and method of forming a protection and support structure for a conductive interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor device may contain semiconductor die mounted to a semiconductor substrate to reduce warpage issues commonly found with laminate substrates. A conductive interconnect structure such as conductive bumps or conductive vias may be formed to mount and electrically connect semiconductor die to the semiconductor substrate, rather than bond wires, due to the cost and manufacturing complexity of forming electrical interconnections with bond wires. The process of forming conductive bumps, however, can lead to the growth of inter-metallic compounds (IMC), which can interfere with the operability and functionality of the semiconductor die. Furthermore, conductive bumps typically have different material and thermal properties than semiconductor die, causing the materials to expand and contract at different rates with heat. The different rates of expansion and contraction of conductive bumps and semiconductor materials lead to early failure of electrical connections between the conductive bumps and semiconductor die. Furthermore, application and reflow of conductive bump material can lead to bridges or electrical shorts between adjacent conductive bumps. Alternatively, forming conductive vias results in conductive contact areas that are very small, which limits the functionality, ease of alignment, and reliability of electrical connections with the conductive vias.

SUMMARY OF THE INVENTION

A need exists for a simple, cost effective, and reliable vertical electrical interconnect structure for semiconductor die. Accordingly, in one embodiment, the present invention is a method of making a semiconductor device comprising the steps of providing a semiconductor wafer having a plurality of contact pads, forming a first insulating layer over the semiconductor wafer and contact pads, removing a portion of the first insulating layer to expose a first portion of the contact pads, while leaving a second portion of the contact pads covered by the first insulating layer, forming an under bump metallization layer over the contact pads and the first insulating layer, forming a plurality of bumps over the under bump metallization layer, forming a second insulating layer over the semiconductor wafer to cover the first insulating layer, a sidewall of the under bump metallization layer, sidewall of the bumps, and upper surface of the bumps, and removing a portion of the second insulating layer covering the upper surface of the bumps, while maintaining coverage of the second insulating layer over the sidewall of the bumps and the sidewall of the under bump metallization layer to provide structural support for the bumps and prevent growth of intermetallic compounds.

In another embodiment, the present invention is a method of making a semiconductor device comprising the steps of providing a semiconductor wafer, forming a plurality of conductive vias through the semiconductor wafer having a portion that extends above a surface of the semiconductor wafer, forming an insulating layer over the semiconductor wafer and the conductive vias, and removing a portion of the insulating layer covering an upper surface of the conductive vias, while maintaining coverage of the insulating layer over a sidewall of the conductive vias to provide structural support for the conductive vias.

In another embodiment, the present invention is a method of making a semiconductor device comprising the steps of providing a semiconductor wafer, forming a conductive interconnect structure having a height extending above a surface of the semiconductor wafer, forming an insulating layer over the semiconductor wafer and the conductive interconnect structure, and removing a portion of the insulating layer covering an upper surface of the conductive interconnect structure while maintaining coverage of the insulating layer over a sidewall of the conductive interconnect structure.

In another embodiment, the present invention is a semiconductor device comprising a semiconductor wafer. A conductive interconnect structure is formed over the semiconductor wafer having a height extending above the semiconductor wafer. An insulating layer is formed over the semiconductor wafer that exposes an upper surface of the conductive interconnect structure while maintaining coverage over a sidewall of the conductive interconnect structure.

BRIEF DESCRIPTION OF THE DRAWINGS

FIGS. 3a-3m illustrate a process of forming conductive bumps on a semiconductor device with a supporting and protective structure;

DETAILED DESCRIPTION OF THE DRAWINGS

Figure 1:
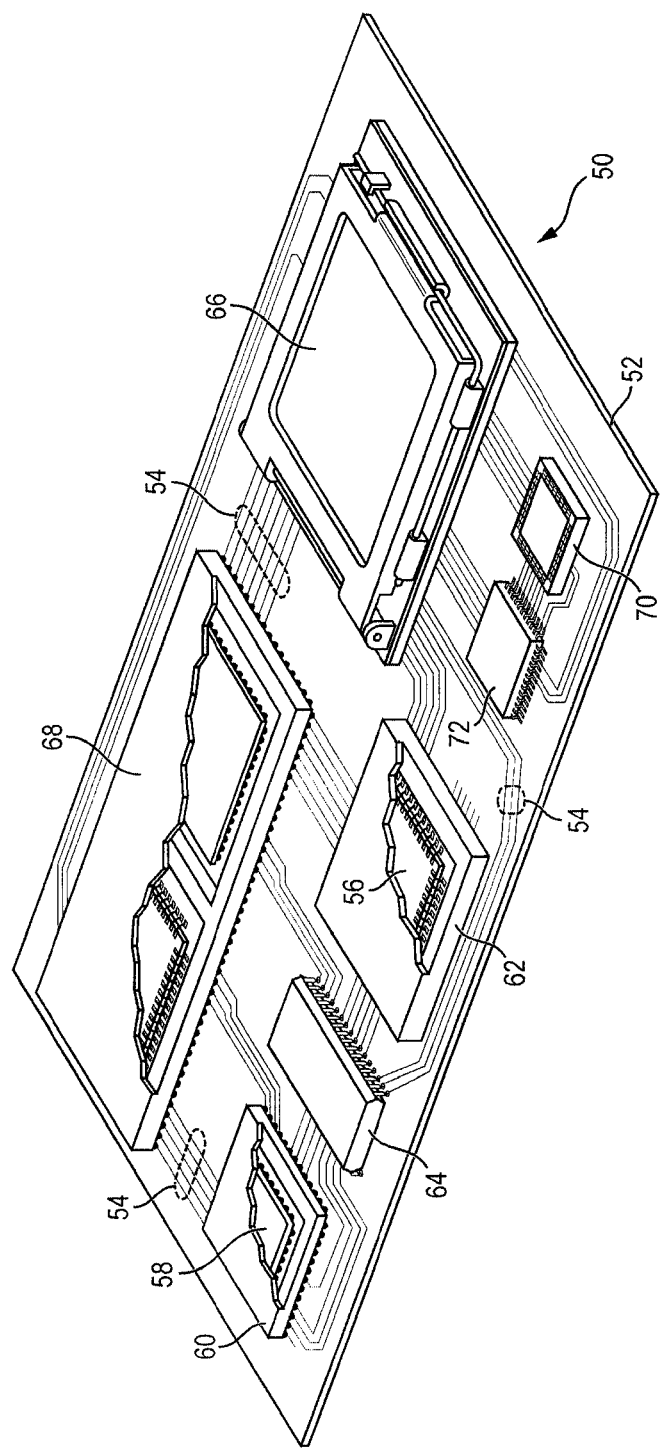
FIG. 1 illustrates a printed circuit board with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photo resist or positive-acting photo resist. Second, the photoresist layer is transferred into the wafer surface. The transfer occurs when etching removes the portion of the top layers of semiconductor wafer not covered by the photoresist. The chemistry of photoresists is such that the photoresist dissolves slowly and resists removal by chemical etching solutions while the portion of the top layers of the semiconductor wafer not covered by the photoresist is removed more rapidly. The process of forming, exposing, and removing the photoresist, as well as the process of removing a portion of the semiconductor wafer can be modified according to the particular resist used and the desired results.

In negative-acting photo resists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photo resists, photoresist is exposed to light and is changed from relatively nonsoluble condition to a much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
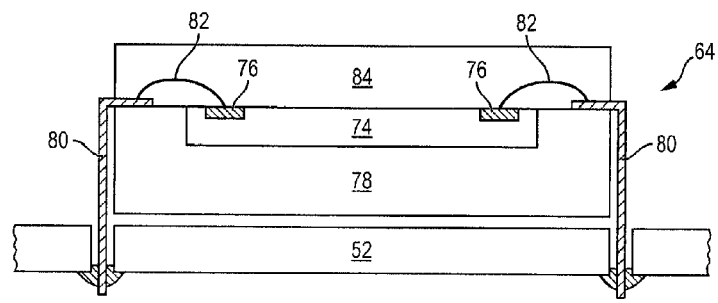
FIGS. 2a-2c illustrate further detail of the representative semiconductor packages mounted to the printed circuit board.
Figure 2B:
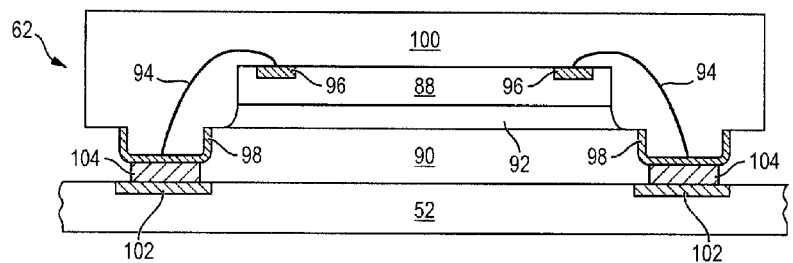
Figure 2C:
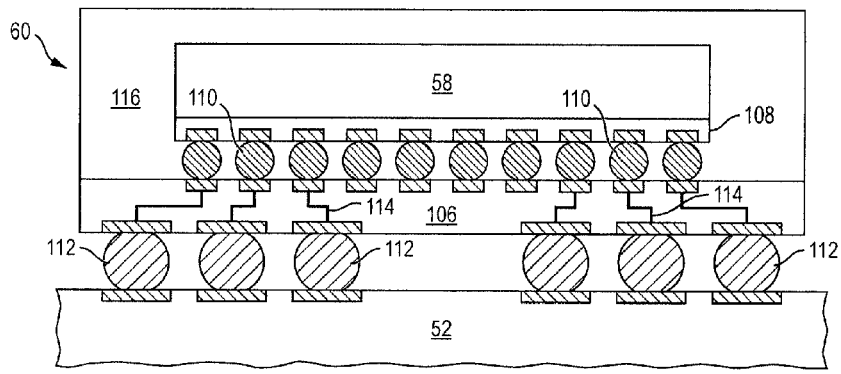

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
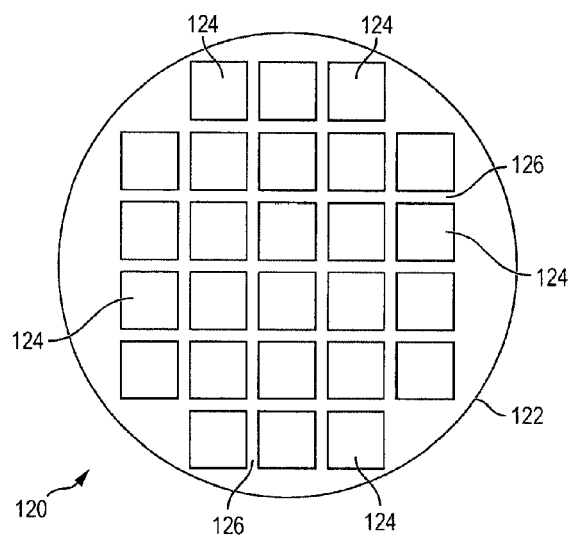

FIGS. 3a-3m illustrate, in relation to FIGS. 1 and 2a-2c, illustrate a process of forming conductive bumps on a semiconductor device with a supporting and protective structure. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
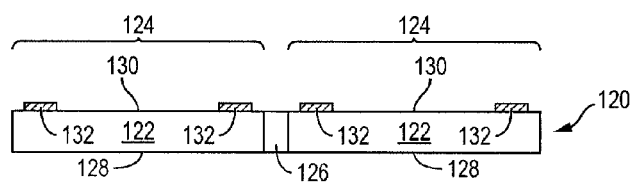

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
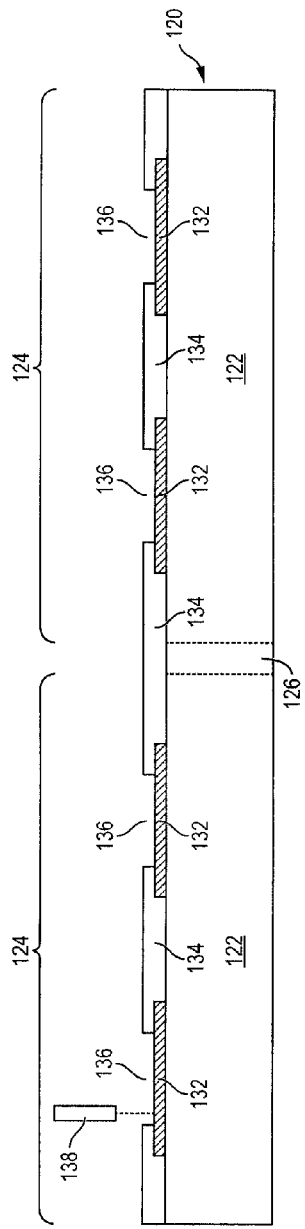

FIG. 3c shows an enlarged cross-sectional view of a portion of semiconductor wafer 120, focusing on contact pads 132 and an area immediately surrounding the contact pad. An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3, or other material having similar insulating and structural properties. A portion of insulating layer 134 is removed by an etching process through a photoresist layer (not shown) to form openings 136 and expose conductive layer 132. Alternatively, openings 136 are formed by laser direct ablation (LDA) using laser 138 to remove a portion of insulating layer 134 and expose conductive layer 132. In one embodiment, openings 136 have a width of 15 μm-80 μm. Another portion of contact pads 132 remains covered by insulating layer 134.

Figure 3D:
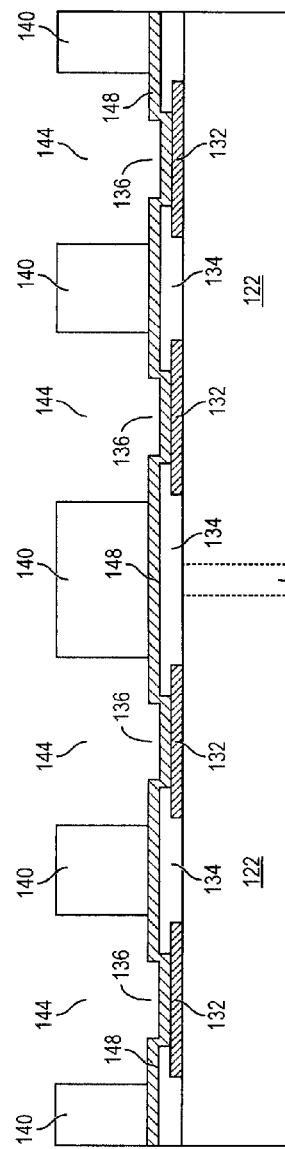

In FIG. 3d, a blanket conductive layer 148 is deposited on insulating layer 134 and conductive layer 132 using a patterning and metal deposition process such as printing, PVD, CVD, electrolytic plating, and electroless plating. In one embodiment, blanket conductive layer 148 acts as a seed layer. Seed layer 148 can be any suitable alloy seed layer, such as titanium copper (TiCu), titanium tungsten copper (TiWCu), or tantalum nitrogen copper (TaNCu). Seed layer 148 follows the contour of insulating layer 134 and conductive layer 132. Seed layer 148 is electrically connected to conductive layer 132.

A patterning or photoresist layer 140 is formed over seed layer 148, insulating layer 134, and conductive layer 132 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 140 is removed by an etching process to form openings 144. Openings 144 expose a portion of seed layer 148, and are positioned over conductive layer 132. In one embodiment, openings 144 have a circular cross-sectional area configured to form conductive bumps with a cylindrical shape including a circular cross-section. In another embodiment, openings 144 have a rectangular cross-sectional area configured to form conductive bumps with a cubic shape including a rectangular cross-section.

Figure 3E:
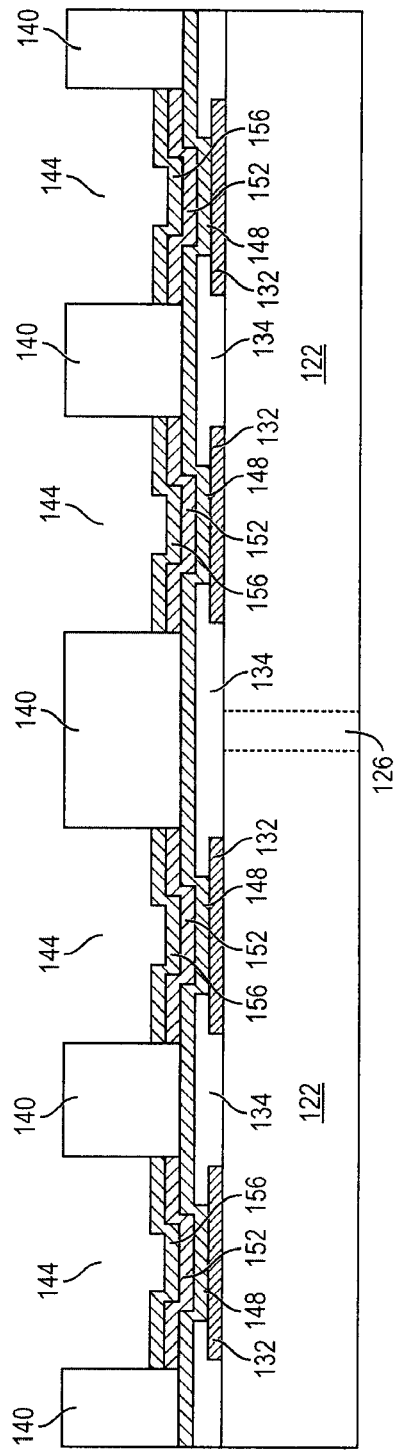

In FIG. 3e, an electrically conductive layer 152 is conformally applied over seed layer 148, within openings 144, using a patterning and metal deposition process such as printing, PVD, CVD, sputtering, electrolytic plating, and electroless plating. Conductive layer 152 can be one or more layers of Al, Cu, Sn, Ti, Ni, Au, Ag, or other suitable electrically conductive material. In one embodiment, conductive layer 152 operates as a barrier layer and can be Ni, nickel vanadium (NiV), platinum (Pt), palladium (Pd), TiW, or CrCu, or other suitable material. Conductive layer 152 follows the contour of seed layer 148. Conductive layer 152 is electrically connected to seed layer 148 and conductive layer 132.

Conductive layer 156 is conformally applied over conductive layer 152 using a patterning and metal deposition process such as printing, PVD, CVD, sputtering, electrolytic plating, and electroless plating. Conductive layer 156 can be one or more layers of Al, Cu, Sn, Ti, Ni, Au, Ag, or other suitable electrically conductive material. In one embodiment, conductive layer 156 operates as an adhesion layer and can be Ti, TiN, TiW, Al, or chromium (Cr), or other suitable material. Conductive layer 156 follows the contour of conductive layer 152. Conductive layer 156 is electrically connected to conductive layer 152, seed layer 148, and conductive layer 132.

Figure 3F:
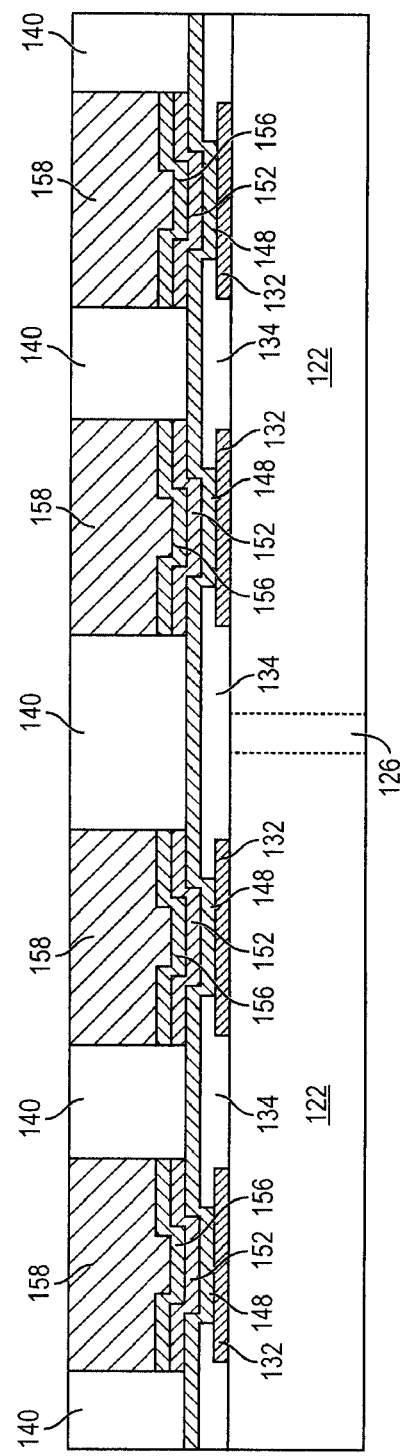

In FIG. 3f, an electrically conductive paste or bump material 158 is deposited within openings 144 and over conductive layer 156 using an evaporation, electrolytic plating, electroless plating, ball drop, or screen printing process. Conductive bump material 158 can be Al, Sn, Ni, Au, Ag, Pb, bismuth (Bi), Cu, indium (In), solder, and combinations thereof, with an optional flux solution. For example, conductive bump material 158 can be eutectic Sn/Pb, high-lead solder, or lead-free solder. Conductive bump material 158 is bonded to conductive layer 156 using a suitable attachment or bonding process. A volume of conductive bump material 158 deposited into openings 144 is controlled by a thickness of photoresist layer 140 and a cross-sectional area or aperture size of openings 144, thereby controlling a final size of the later-formed conductive bump.

In FIG. 3g, photoresist layer 140, and a portion of seed layer 148 outside a footprint of conductive layers 152 and 156, are removed using an etching process. Collectively, the remaining portion of seed layer 148, conductive layer 152, and conductive layer 156 constitute under bump metallization (UBM) layer 159. A plurality of bumps 162, comprising a volume of conductive bump material 158 and UBM layer 159, is electrically connected to conductive layer 132. In one embodiment, the bump material is reflowed by heating bump material 158 above its melting point. In some applications, bumps 162 are reflowed a second time to improve electrical contact to conductive layer 156. Bumps 162 have a height H1 that extends from an upper surface of insulating layer 134, to an upper surface of bump material 158.

In FIG. 3h, an insulating layer 170 is deposited over bumps 162, and insulating layer 134 using PVD, CVD, printing, spin coating, spray coating, screen printing, or lamination. Insulating layer 170 can be one or more layers of SiO2, Si3N4, SiON, Ta2O5, Al2O3, BCB, polyimide (PI), suitable dielectric material, photosensitive or non-photosensitive polymer dielectric, such as polybenzoxazoles (PBO), low temperature curing polymer dielectric resist, e.g., less than 250° C., SiN, SiON, or SiO2, or other material having similar insulating and structural properties.

In FIG. 3i, insulating layer 170 is blanket etched using a plasma process, wet chemical etching, LDA, or photoresist developing process to reduce the thickness of insulating layer 170 and remove the portion of insulating layer 170 covering bumps 162. In one embodiment, an optional blind UV exposure may be applied before the photolithography developing process. The remaining insulating layer 170 constitutes support structure 180.

Support structure 180 covers a portion of a sidewall of bumps 162, sidewall of UBM layer 159, junction between UBM layer 159 and insulating layer 134, and insulating layer 134 adjacent to UBM layer 159. Support structure 180 provides structural support to bumps 162 and helps to maintain the electrical connection between bumps 162 and contact pads 132 during expansion and contraction of the materials. Support structure 180 also environmentally seals the junction between UBM layer 159 and insulating layer 134 to reduce the occurrence of the growth of IMC. Support structure 180 also contains bumps 162 during the reflow of bump material 158 to reduce the occurrence of bridging or electrical shorts between adjacent bumps 162. In one embodiment, end-point detection or time-controlled etching is used to ensure that the portion of support structure 180 adjacent to bumps 162 has a height greater than one fourth of H1.

In another embodiment, shown in FIG. 3j, support structure 180 covers a portion of the sidewall of bumps 162, sidewall of UBM layer 159, junction between UBM layer 159 and insulating layer 134, and portion of insulating layer 134 adjacent to UBM layer 159. The blanket etching process of removing a portion of insulating layer 170 to form support structure 180 also removes a portion of support structure 180 over insulating layer 134.

FIG. 3k shows a top or plan view of bumps 162 with a circular cross-section, after support structure 180 has been formed over insulating layer 134 and contact pads 132. Support structure 180 surrounds bump material 158. FIG. 3l shows a top or plan view of bumps 162 with a rectangular cross-section, after support structure 180 has been formed over insulating layer 134 and contact pads 132. Support structure 180 surrounds bump material 158.

Figure 3M:
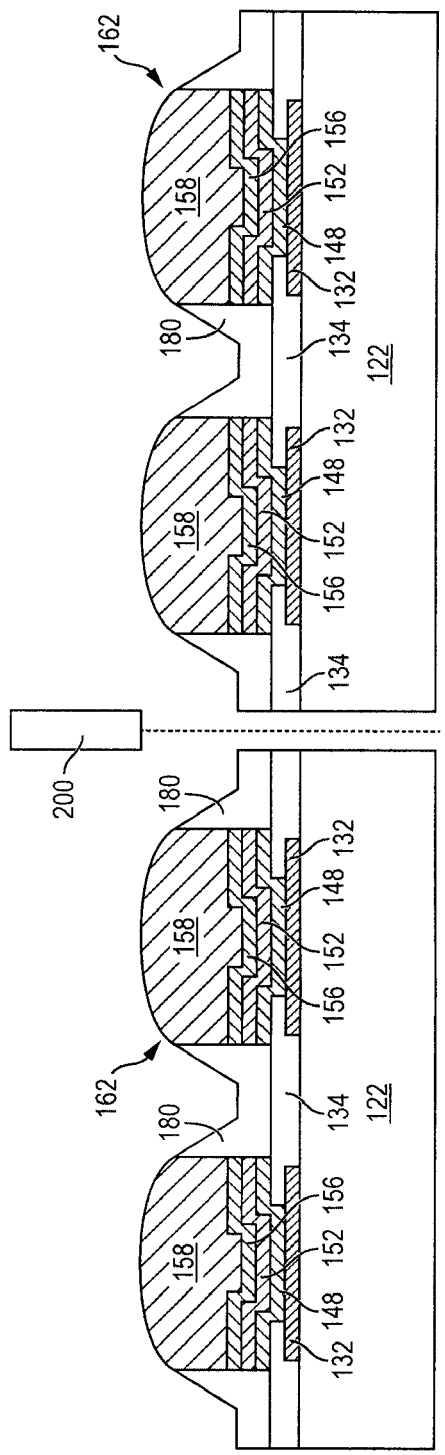

In one embodiment, shown in FIG. 3m, bump material 158 is reflowed by heating conductive bump material 158 above its melting point, creating a dome-shaped upper surface of bumps 162. In some applications, bump material 158 is reflowed multiple times to improve electrical and mechanical connections. Support structure 180 contains bump material 158 during the reflow process and reduces the occurrence of bridging or electrical shorts between adjacent bumps 162. Support structure 180 also reduces the growth of IMC during the reflow process. Support structure 180 also provides structural support for bumps 162 and the electrical connection between bumps 162 and contact pads 132 during expansion and contraction of the materials. The assembly is singulated along saw street 126 with saw blade or laser cutting tool 200.

Figure 4:
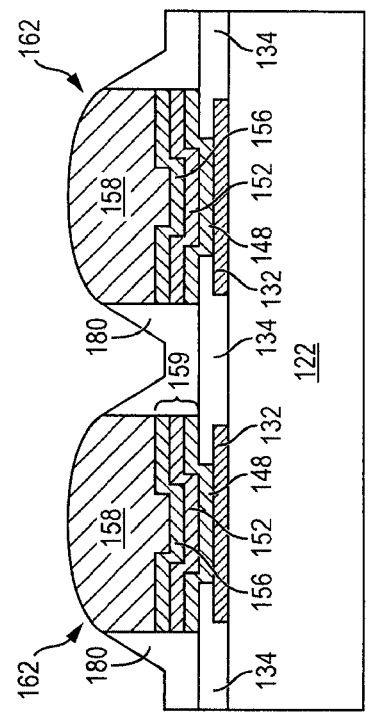
FIG. 4 illustrates a semiconductor device with conductive bumps having a supporting and protective structure.

FIG. 4 shows the assembly from FIGS. 3a-3m after singulation. Contact pads 132 are formed over active surface 130 of semiconductor die 124, and are electrically connected to UBM layer 159, and bump material 158. Collectively, bump material 158 and UBM layer 159 constitute bumps 162. Bumps 162 have a height H1, extending from the upper surface of insulating layer 134 to the upper surface of bumps 162.

An insulating layer 170 is formed over bumps 162 and semiconductor die 124. Insulating layer 170 is etched to remove a portion of insulating layer 170 covering the upper surface of bumps 162. The remaining insulating layer 170 constitutes support structure 180. Support structure 180 covers a portion of a sidewall of bumps 162, sidewall of UBM layer 159, junction between UBM layer 159 and insulating layer 134, and insulating layer 134 adjacent to UBM layer 159. In one embodiment, the portion of support structure 180 adjacent to bumps 162 has a height greater than one fourth of H1.

Support structure 180 provides structural support to bumps 162 and helps to maintain the electrical connection between bumps 162 and contact pads 132 during expansion and contraction of the materials. Support structure 180 also environmentally seals the junction between UBM layer 159 and insulating layer 134 to reduce the occurrence of the growth of IMC. Support structure 180 also contains bumps 162 during the reflow of bump material 158 to reduce the occurrence of bridging or electrical shorts between adjacent bumps 162.

Figure 5A:
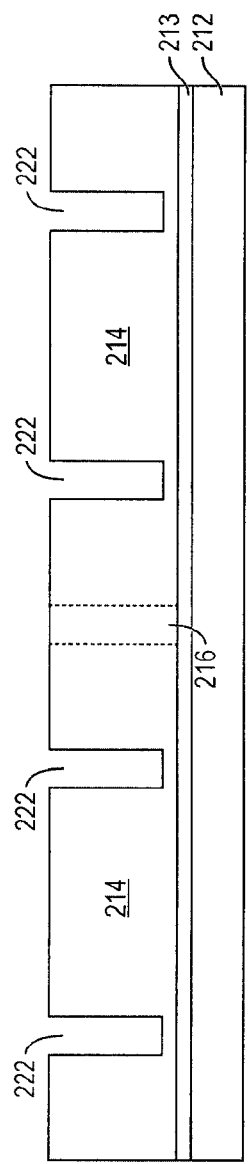
FIGS. 5a-5o illustrate a process of forming conductive vias through a semiconductor device with a supporting and protective structure and electrically connected contact pads.
Figure 5B:
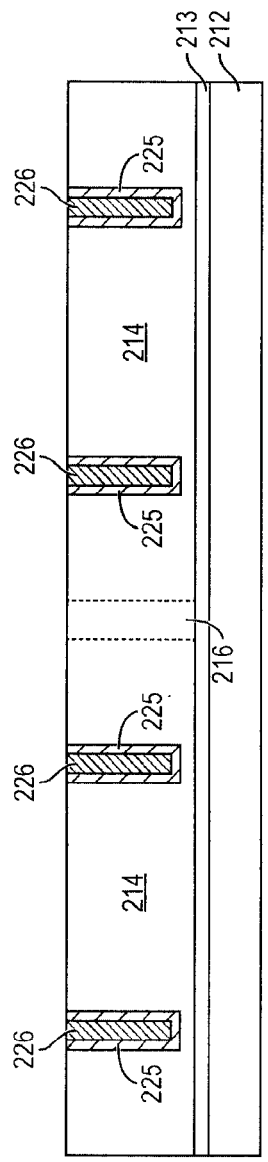
Figure 5C:
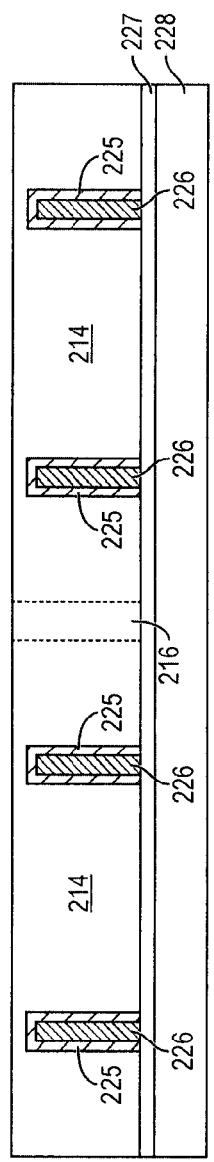
Figure 5D:
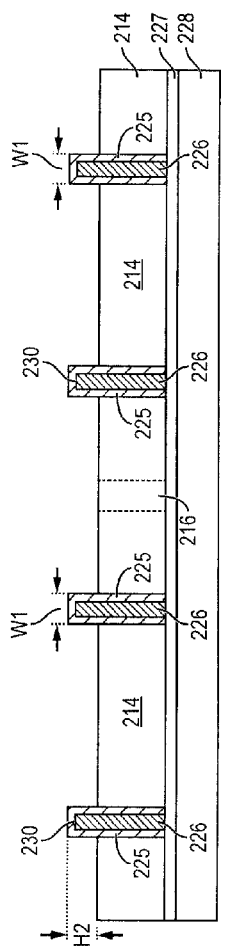
Figure 5E:
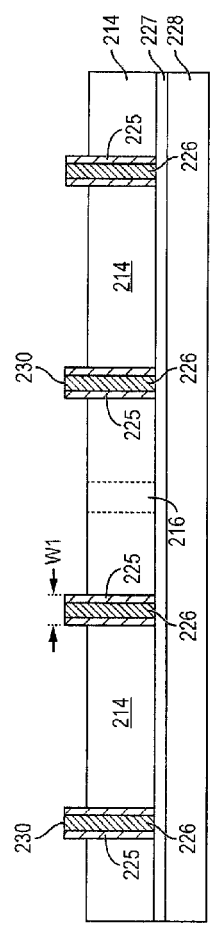
Figure 5F:
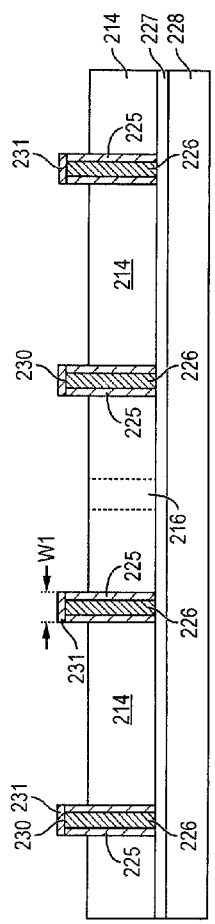
Figure 5G:
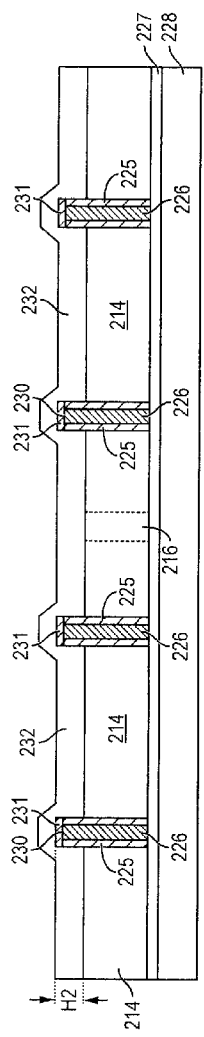
Figure 5H:
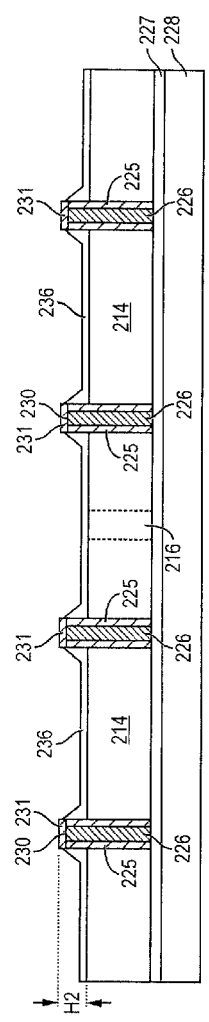
Figure 5I:
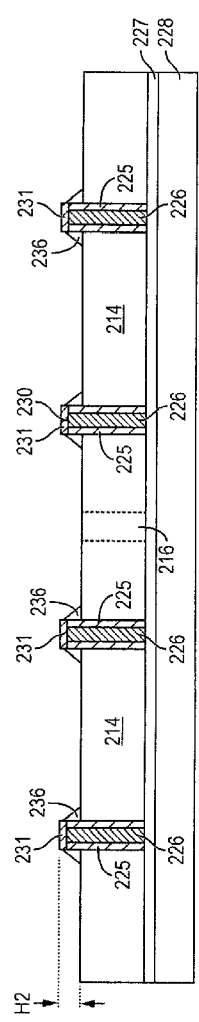
Figure 5J:
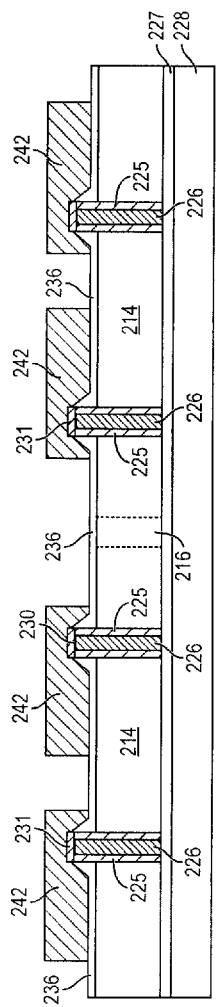
Figure 5K:
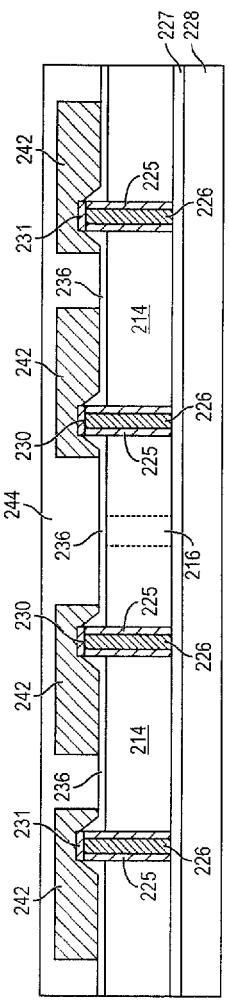
Figure 5L:
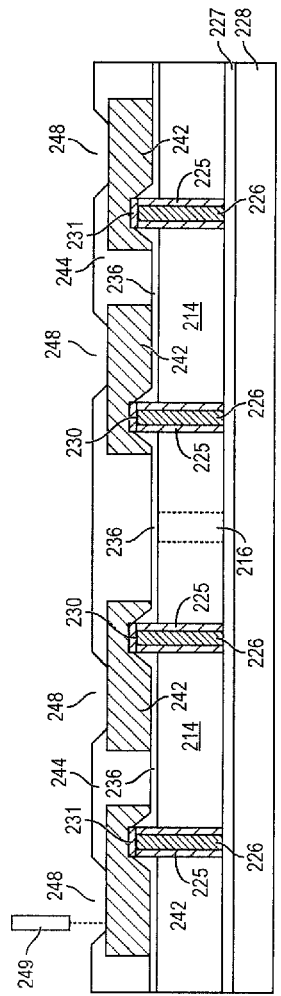
Figure 5M:
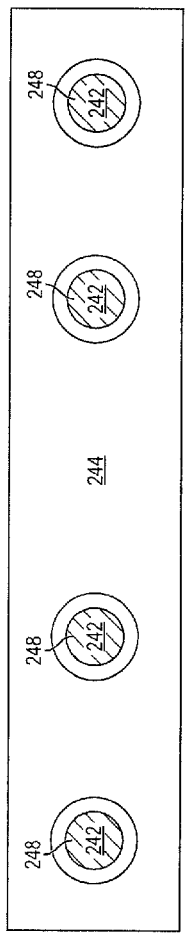
Figure 5N:
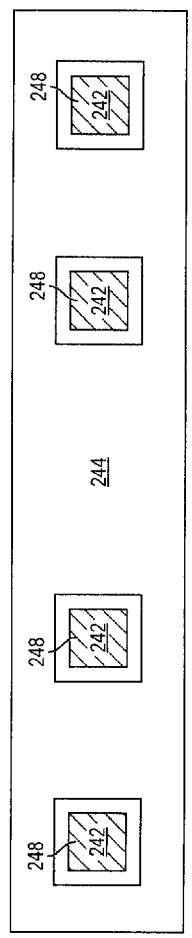

FIGS. 5a-5n illustrate, in relation to FIGS. 1 and 2a-2c, a process of forming conductive vias through a semiconductor device with supporting structures and electrically connected contact pads. In FIG. 5a, a temporary substrate or carrier 212 contains sacrificial base material such as silicon, polymer, beryllium oxide, glass, or other suitable low-cost, rigid material for structural support. An interface layer or double-sided tape 213 is formed over carrier 212 as a temporary adhesive bonding film, etch-stop layer, or release layer. A semiconductor wafer or substrate 214 contains base material, such as silicon, germanium, gallium arsenide, indium phosphide, or silicon carbide, for structural support. As a semiconductor wafer, substrate 214 can contain embedded integrated semiconductor die or discrete devices. Substrate 214 can also be a multi-layer flexible laminate, ceramic, or leadframe. Substrate 214 has a non-active inter-die wafer area or saw street 216 to provide a cutting area to singulate substrate 214 into individual semiconductor die as described above. Substrate 214 is mounted to interface layer 213 over carrier 212. A plurality of blind vias 222 is formed through substrate 214 using laser drilling, mechanical drilling, or DRIE. In one embodiment, blind vias 222 do not extend through the entire substrate 214.

In FIG. 5b, the sidewalls of blind vias 222 are coated with a liner layer 225 using PVD, CVD, printing, spin coating, or spray coating. Liner layer 225 can be one or more layers of silicon nitride (SiN), SiON, Ta2O3, or other insulating thin film, together with a suitable conductive glue or barrier layer, and can include any suitable conductive liner alloy such as TaN, or TiN, or any other suitable conductive liner material. Blind vias 222 are filled with Al, Cu, Sn, Ni, Au, Ag, Ti, W, poly-silicon, or other suitable electrically conductive material using electrolytic plating, electroless plating process, or other suitable metal deposition process to form z-direction vertical conductive blind vias 226.

In FIG. 5c, interface layer 227 is formed over a temporary substrate or carrier 228. Carrier 228 contains sacrificial base material such as silicon, polymer, beryllium oxide, glass, or other suitable low-cost, rigid material for structural support. Interface layer 227 acts as a temporary adhesive bonding film, etch-stop layer, or release layer. Substrate 214 is inverted and mounted over carrier 228 with interface layer 227. A surface of conductive blind vias 226 contact interface layer 227. Carrier 212 and interface layer 213 are removed by chemical etching, mechanical peeling, CMP, mechanical grinding, thermal bake, UV light, laser scanning, or wet stripping to expose a surface of substrate 214.

In FIG. 5d, a portion of substrate 214 is removed by mechanical grinding, chemical etching, chemical-mechanical planarization, or reactive ion etching (RIE), to expose an upper surface of substrate 214, and an upper portion of conductive vias 226. Conductive blind vias 226 have a cross-sectional width W1. In one embodiment, width W1 is 10 µm. Conductive blind vias 226 have a height H2, extending from the upper surface of substrate 214 to the portion of liner layer 225 covering surface 230 of conductive blind vias 226.

In FIG. 5e, the portion of liner layer 225 covering conductive blind vias 226 is removed by mechanical grinding, chemical etching, chemical-mechanical planarization, or RIE to expose surface 230 of conductive blind vias 226. In embodiments where liner layer 225 includes an insulating material and a glue or barrier layer, after removing a portion of liner layer 225 to expose surface 230 of conductive blind vias 226, surface 230 provides a contact surface for improved electrical interconnect between conductive blind vias 226 and subsequently formed conductive layers.

In another embodiment, shown in FIG. 5f, the insulating thin film of the portion of liner layer 225 covering conductive blind vias 226 is removed by mechanical grinding, chemical etching, chemical-mechanical planarization, or RIE, while leaving the conductive material including the glue or barrier layer of liner layer 225. The remaining portion of liner layer 225 maintains coverage over surface 230 of conductive blind vias 226 and constitutes a conductive liner layer 231. Conductive liner layer 231 includes the conductive glue or barrier layers, conductive liner alloy, or conductive liner material of liner layer 225. Removing the insulating thin film of liner layer 225 to form conductive liner layer 231 over surface 230 of conductive blind vias 226 enables improved electrical interconnectivity between conductive blind vias 226 and subsequently formed conductive layers.

Continuing from FIG. 5f, an insulating layer 232 is deposited over substrate 214 and conductive vias 226 using PVD, CVD, printing, spin coating, spray coating, screen printing or lamination, as shown in FIG. 5g. Insulating layer 232 can be one or more layers of SiO2, Si3N4, SiON, Ta2O5, Al2O3, BCB, polyimide (PI), suitable dielectric material, photosensitive or non-photosensitive polymer dielectric, such as polybenzoxazoles (PBO), low temperature curing polymer dielectric resist, e.g., less than 250° C., SiN, SiON, or SiO2, or other material having similar insulating and structural properties.

In FIG. 5h, insulating layer 232 is blanket etched using a plasma process, wet chemical etching, LDA, or photoresist developing process to reduce the thickness of insulating layer 232 and to remove a portion of insulating layer 232 covering the upper surface of conductive vias 226. In one embodiment, the blanket etching process of insulating layer 232 can also remove the portion of liner layer 225 covering conductive blind via 226 to expose surface 230 of conductive blind via 226. In embodiments where liner layer 225 is an insulating material, removing a portion of liner layer 225 to expose surface 230 of conductive blind vias 226, surface 230 provides a contact surface for electrical interconnect between conductive blind vias 226 and subsequently formed conductive layers. In embodiments where liner layer 225 is a conductive alloy, exposing surface 230 of conductive blind vias 226 enables improved electrical interconnectivity between conductive blind vias 226 and subsequently formed conductive layers. After the blanket etching process, the remaining portion of insulating layer 232 constitutes support structure 236.

Support structure 236 covers a portion of a sidewall of conductive vias 226, junction between conductive vias 226, and substrate 214 adjacent to conductive vias 226. Support structure 236 provides structural support to conductive vias 226 during expansion and contraction of the materials. Support structure 236 also environmentally seals the junction between conductive vias 236 and substrate 214 to reduce the occurrence of the growth of IMC. In one embodiment, endpoint detection or time-controlled etching is used to ensure that the portion of support structure 236 adjacent to conductive vias 226 has a height greater than one fourth of H2.

In another embodiment, shown in FIG. 5i, support structure 236 covers a portion of the sidewall of conductive vias 226, junction between conductive vias 226 and substrate 214, and portion of substrate 214 adjacent to conductive vias 226. The blanket etching process of removing a portion of insulating layer 232 to form support structure 236 also removes a portion of support structure 236 over insulating layer 232.

Continuing from FIG. 5h, an electrically conductive layer 242 is formed over support structure 236, substrate 214, and conductive vias 226 using PVD, CVD, electrolytic plating, electroless plating process, or other suitable metal deposition process, as shown in FIG. 5j. Conductive layer 242 can be one or more layers of Al, Cu, Sn, Ni, Au, Ag, or other suitable electrically conductive material. Conductive layer 242 operates as contact pads electrically connected to conductive vias 226, but with an upper surface area greater than the upper surface area of conductive vias 226.

In FIG. 5k, an insulating or passivation layer 244 is formed over substrate 214, support structure 236, and conductive layer 242 using PVD, CVD, printing, spin coating, spray coating, sintering or thermal oxidation. The insulating layer 244 contains one or more layers of SiO2, Si3N4, SiON, Ta2O5, Al2O3, or other material having similar insulating and structural properties.

In FIG. 5l, a portion of insulating layer 244 is removed by an etching process through a photoresist layer (not shown) to forming openings 248 and expose conductive layer 242. Alternatively, openings 248 are formed by LDA using laser 249 to remove a portion of insulating layer 244 and expose conductive layer 242. In one embodiment, openings 248 have a cross-sectional width greater than width W1. Another portion of contact pads 242 remains covered by insulating layer 244. The sidewalls of openings 248 can have a tapered, straight, or stepped profile. In one embodiment, openings 248 have a cross-sectional area greater than a surface area of the upper surface of conductive vias 226.

FIG. 5m shows a top or plan view of the assembly from FIG. 5l, with openings 248 having a circular cross-section to expose a portion of the upper surface of conductive layer 242. In one embodiment, the exposed surface of conductive layer 242 has a larger surface area than a surface area of the upper surface of conductive vias 226. FIG. 5n shows a top or plan view of the assembly from FIG. 5l, with openings 248 having a rectangular cross-section to expose a portion of the upper surface of conductive layer 242. In one embodiment, the exposed surface of conductive layer 242 has a larger surface area than a surface area of the upper surface of conductive vias 226. Because the exposed conductive surface is larger than the surface area of conductive vias 226, the alignment, functionality, and reliability of electrical connections with additional electronic devices is improved.

Figure 5O:
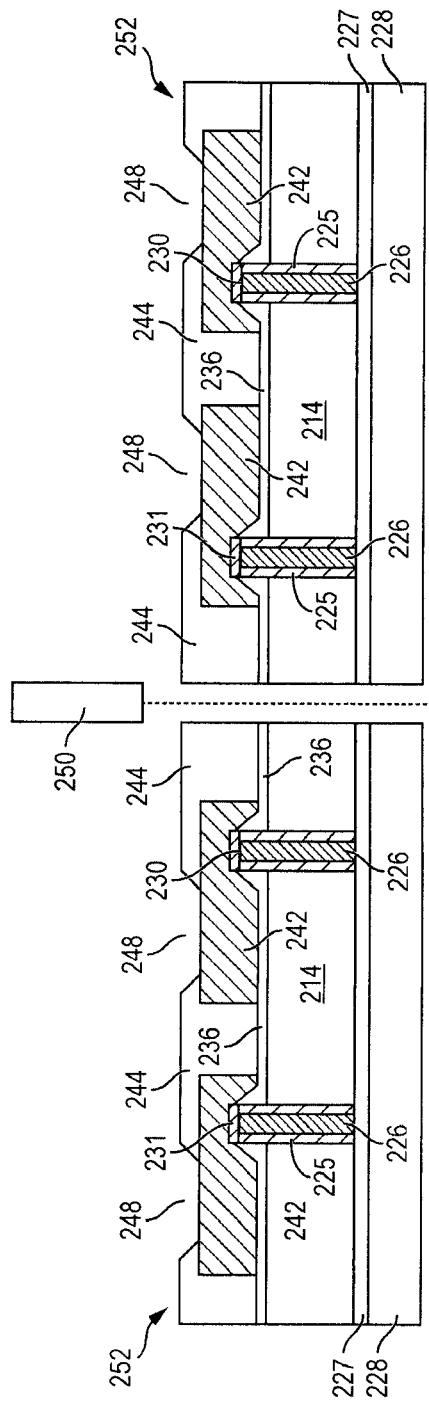

In FIG. 5o, the assembly from FIG. 5k is singulated through insulating layer 244, support structure 236, substrate 214, and saw street 216 with saw blade or laser cutting tool 250 into individual semiconductor package 252.

Figure 6:
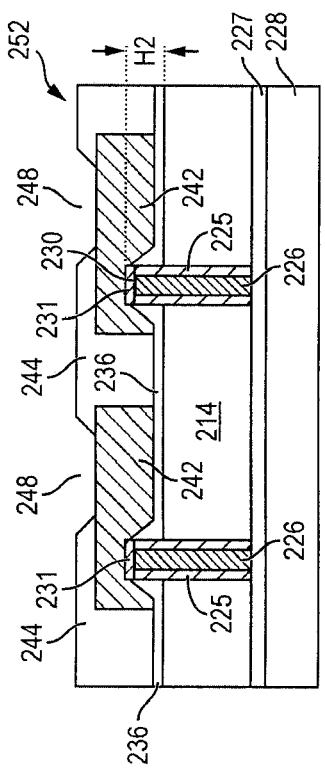
FIG. 6 illustrates conductive vias through a semiconductor device with a supporting and protective structure and electrically connected contact pads.

FIG. 6 shows semiconductor package 252 after singulation. Conductive vias 226 are formed through substrate 214 and have a height H2, extending from the upper surface of substrate 214 to the upper surface of conductive vias 226.

An insulating layer 232 is formed over conductive vias 226 and substrate 214. Insulating layer 232 is etched to remove a portion of insulating layer 232 covering the upper surface of conductive vias 226. The remaining insulating layer 232 constitutes support structure 236. Support structure 236 covers a portion of a sidewall of conductive vias 226, junction between conductive vias 226 and substrate 214, and substrate 214 adjacent to conductive vias 226. In one embodiment, the portion of support structure 236 adjacent to conductive vias 226 has a height greater than one fourth of H2.

Support structure 236 provides structural support to conductive vias 226 during expansion and contraction of the conductive vias 226 and substrate 214. Support structure 236 also environmentally seals the junction between conductive vias 226 and substrate 214 to reduce the occurrence of the growth of IMC.

Conductive layer 242 is formed over support structure 236, conductive vias 226, and substrate 214 and operates as a contact pad. Conductive layer 242 is electrically connected to conductive vias 226 with a surface area greater than the surface area of conductive vias 226. Insulating layer 244 is formed over conductive layer 242 and a portion of insulating layer 244 is removed by an etching process to create openings 248. In one embodiment, openings 248 have a cross-sectional area greater than an upper surface of conductive vias 226. Because the exposed conductive surface is larger than the surface area of conductive vias 226, the alignment, functionality, and reliability of electrical connections with additional electronic devices is improved.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor wafer having a plurality of contact pads;
   forming a first insulating layer over the semiconductor wafer and contact pads;
   removing a portion of the first insulating layer to expose a first portion of the contact pads, while leaving a second portion of the contact pads covered by the first insulating layer;
   forming an under bump metallization layer over the contact pads and the first insulating layer;
   forming a plurality of bumps over the under bump metallization layer;
   forming a second insulating layer over the semiconductor wafer to cover the first insulating layer, a sidewall of the under bump metallization layer, sidewall of the bumps, and upper surface of the bumps; and
   removing a portion of the second insulating layer over a first portion of the sidewall of the bumps down to the first insulating layer, while maintaining coverage of the second insulating layer over a second portion of the sidewall of the bumps and over the sidewall of the under bump metallization layer to provide structural support for the bumps and prevent growth of inter-metallic compounds.

2. The method of claim 1, wherein removing the portion of the second insulating layer further includes maintaining a thickness of the second insulating layer at the sidewall of the bumps greater than one fourth of a height of the bumps.

3. The method of claim 1, wherein forming the bumps includes forming cylindrical bumps.

4. The method of claim 1, wherein forming the bumps includes forming bumps with a rectangular cross-section.

5. The method of claim 1, wherein forming the under bump metallization layer further includes:
   forming an adhesion layer over the plurality of contact pads;
   forming a barrier layer over the adhesion layer; and
   forming a wetting layer over the barrier layer.

6. A method of making a semiconductor device, comprising:
- providing a semiconductor wafer;
- forming a plurality of vias into the semiconductor wafer;
- forming a liner layer in the vias;
- depositing conductive material over the liner layer in the vias to form a plurality of conductive vias;
- removing a portion of the semiconductor wafer so the conductive vias extend above a surface of the semiconductor wafer;
- removing a portion of the liner layer to expose the conductive material;
- forming a conductive liner over the conductive material after removing the portion of the liner layer;
- forming an insulating layer over the semiconductor wafer and the conductive vias; and
- removing a portion of the insulating layer leaving the conductive liner extending above the insulating layer, while maintaining coverage of the insulating layer over a sidewall of the conductive vias to provide structural support for the conductive vias.

7. The method of claim 6, wherein removing the portion of the insulating layer includes maintaining a thickness of the insulating layer greater than one fourth a height of the portion of the conductive vias that extends above the surface of the semiconductor wafer.

8. The method of claim 6, further including:
- forming a plurality of semiconductor die in the semiconductor wafer; and
- singulating the semiconductor die.

9. The method of claim 6, further including:
- forming a conductive layer over and electrically connected to the conductive vias;
- forming an insulating layer over the semiconductor wafer and the conductive layer; and
- removing a portion of the insulating layer over the conductive layer to expose a surface area of the conductive layer greater than a surface area of an upper surface of the conductive vias.

10. The method of claim 6, further including removing the portion of the insulating layer down to the semiconductor wafer.

11. A method of making a semiconductor device, comprising:
- providing a semiconductor wafer;
- forming a conductive interconnect structure through the semiconductor wafer and including a height extending above a surface of the semiconductor wafer;
- forming an insulating layer over the semiconductor wafer and the conductive interconnect structure with the insulating layer including a height greater than the height of the conductive interconnect structure; and
- removing a portion of the insulating layer to leave a sloped contour of the insulating layer over a sidewall of the conductive interconnect structure.

12. The method of claim 11, wherein providing the semiconductor wafer further includes forming a plurality of semiconductor die in the semiconductor wafer.

13. The method of claim 11, wherein forming the conductive interconnect structure further includes forming a plurality of conductive vias through the semiconductor wafer.

14. The method of claim 11, further including forming one or more redistribution layers over and electrically connected to the conductive interconnect structure.

15. The method of claim 11, wherein removing the portion of the insulating layer further includes maintaining a thickness of the insulating layer greater than one fourth the height of the conductive interconnect structure extending above the surface of the semiconductor wafer.

16. The method of claim 11, further including removing the portion of the insulating layer down to the semiconductor wafer.

17. A method of making a semiconductor device, comprising:
- providing a substrate;
- forming an interconnect structure through the substrate and including a height extending above a surface of the substrate;
- forming an insulating layer over the substrate and interconnect structure; and
- removing a portion of the insulating layer to leave a sloped contour of the insulating layer over a portion of a sidewall of the interconnect structure.

18. The method of claim 17, wherein removing the portion of the insulating layer further includes maintaining a thickness of the insulating layer greater than one fourth a height of the interconnect structure extending above a surface of the substrate.

19. The method of claim 17, wherein forming the interconnect structure further includes forming a plurality of conductive vias through the substrate.

20. The method of claim 17, further including forming one or more redistribution layers over and electrically connected to the interconnect structure.

21. The method of claim 17, further including removing the portion of the insulating layer down to the substrate.

\* \* \* \* \*